United States Patent [19]

Pechar

[11] Patent Number: 4,547,684

[45] Date of Patent: Oct. 15, 1985

[54] CLOCK GENERATOR

[75] Inventor: Henry Pechar, Bayville, N.Y.

[73] Assignee: Standard Microsystems Corporation, Hauppauge, N.Y.

[21] Appl. No.: 525,286

[22] Filed: Aug. 22, 1983

[51] Int. Cl.[4] .......................... H03K 5/15; H03K 3/353; H03K 19/094
[52] U.S. Cl. .................................... 307/481; 307/269; 307/262; 307/605; 307/582; 307/453; 328/63; 328/57; 328/55
[58] Field of Search ............... 307/269, 582, 480, 481, 307/601, 605, 262, 448, 453, 443, 475; 328/34, 57, 55, 63

[56] References Cited

U.S. PATENT DOCUMENTS

| | | | |
|---|---|---|---|
| 4,034,242 | 7/1977 | Heeren | 307/269 |
| 4,045,685 | 8/1977 | Gehrig | 307/208 |
| 4,140,927 | 2/1979 | Feucht | 307/262 |

Primary Examiner—Stanley D. Miller
Assistant Examiner—Richard Roseen
Attorney, Agent, or Firm—Hopgood, Calimafde, Kalil, Blaustein & Judlowe

[57] ABSTRACT

A clock generator for producing nonoverlapping clocks from an input clock includes an MOS depletion-mode device receiving the input clock at an input. The output of the depletion-mode device, which constitutes one of the clocks, is also applied to one input of a NOR gate, the other input of which is the input clock. The output of the NOR gate is the second clock.

1 Claim, 3 Drawing Figures

CLOCK GENERATOR

BACKGROUND

The present invention relates to a clock generator for producing nonoverlapping clock signals.

A large number of logic circuits including shift registers require two-phase clock signals to control their various operations. Two-phase clock signals are clock or timing signals in which the high and low levels are nominally 180° out of phase. To ensure that no logical errors occur in the operation of the logic circuit the two-phase clock signals must be nonoverlapping, that is, one must be high when the other is low and vice versa; the two clock signals should not be both high (or low) at the same time. It is also advantageous, particularly when the clock generator is implemented in the form of an MOS LSI integrated circuit, for the two-phase clock generator to consume a minimum amount of power and to employ a minimum number of devices so as to reduce the amount of chip area required to implement the circuit.

In one presently known clock generator, the input clock is applied to an input of a depletion-mode MOS device, the output of which constitutes one of the clocks. The input clock is also applied to the input of an inverter, which produces the other clock at its output. It has been found that as a result of the relatively high capacitance of the output of the depletion-mode MOS device in this prior art circuit, the fall time of the lagging edge of the clock is relatively long, which creates the likelihood of a degree of overlap between the two clocks that could, in turn, result in unacceptable errors in the logic operations controlled by these clocks.

SUMMARY

It is accordingly an object of the present invention to provide a clock generator which reliably produces nonoverlapping clocks.

It is a further object of the present invention to provide a clock generator of the type described, which employs relatively few MOS devices and which consumes a relatively low amount of power during its operation.

To these ends, the clock generator of the present invention includes a depletion-mode MOS device receiving an input clock at an input. The output of the depletion-mode MOS device, which constitutes one of the clocks, is also applied to one input of a NOR gate, the other input of which is the input clock. The output of the NOR gate is the second clock.

To the accomplishment of the above and such further objects as may hereinafter appear, the present invention relates generally to a clock generator substantially as defined in the appended claims and as described in the following specification, as considered with the accompanying drawing in which:

Figure 1:
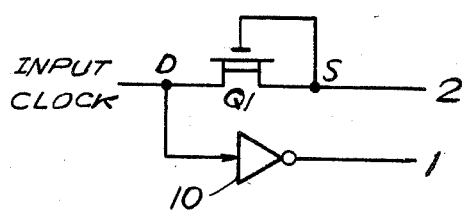
FIG. 1 is a schematic of a prior art clock generator.

The prior art clock generator of the type shown in FIG. 1, is designed to generate two-phase clocks 1 and 2. As shown, that prior art circuit includes a depletion-mode MOS device Q1 having an input terminal, here the drain, which receives an input clock. The output terminal of MOS device Q1 is connected to its gate so that MOS device Q1 is always conductive. The input clock is also applied to an input of an inverter 10, the output of which constitutes one of the clocks. The signal developed at the source of depletion-mode device Q1 is the other clock.

It has been observed in the prior art circuit of FIG. 1, that, as a result of the relatively large capacitance at the output (source) of depletion-mode device Q1, the decay time of the lagging edge of the "high" clock signal at the output of device Q1 is relatively long, which causes that clock to overlap the leading edge of the following clock signal developed at the output of inverter 10. This overlapping of the two clocks results in the adverse effects described above.

Figure 2:
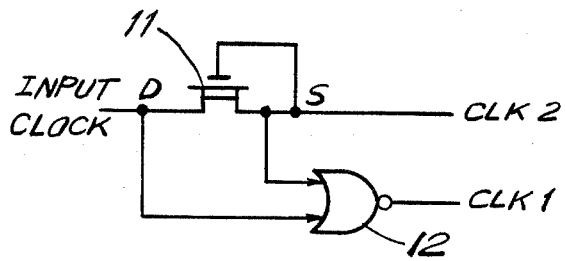
FIG. 2 is a schematic of a clock generator according to an embodiment of the present invention.
Figure 3:
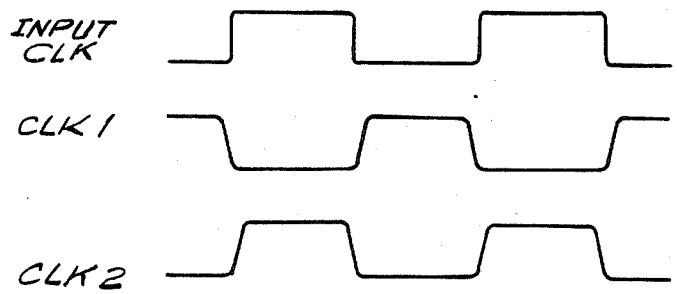
FIG. 3 illustrates the waveforms of the input clock and the two-phase clocks developed by the clock generator of the invention.

This problem of the generation of overlapping two-phase clocks in the prior art circuit of FIG. 1 is overcome in the clock generator of the present invention, an embodiment of which is illustrated in FIG. 2. That clock generator produces two nonoverlapping clocks CLK 1 and CLK 2, which, as shown in FIG. 3, are 180° out of phase with respect to one another; that is, when CLK 1 is high, CLK 2 is low, and vice versa. As shown in FIG. 2, in the clock generator of the invention the input clock is applied to the input terminal (drain) of a depletion-mode MOS device 10 which produces at its output (source) one of the nonoverlapping clocks CLK 2. As in the prior art clock generator of FIG. 1, the source of device Q1 is connected to its gate so that the device is always conductive. However, in contrast to the prior art clock generator of FIG. 1, the output of MOS device Q1, which, as noted, is the clock CLK 2, is also applied to one input of a NOR gate 12, the other input of which receives the input clock signal. The output of NOR gate 12 is the other clock CLK 1.

In the operation of the clock generator of FIG. 2, when the input clock is at a logic one or high level, the output of NOR gate 12 is quickly forced to the logic zero or low level. The impedance of MOS device Q1 limits the rise time of CLK 2 at its output, thereby reducing clock overlap on the positive-going edge of the input clock. On the falling edge of the input clock, one input of NOR gate 12 is brought to a zero level immediately. However, the second input of NOR gate 12, which is the CLK 2 output of MOS device Q1, is not brought to a logic zero until the CLK 2 clock is brought to a logic zero or low level by device Q1. The fall time of the CLK 2 clock is rapid since the depletion-mode MOS device Q1 is driven at this time. Once both inputs to NOR gate 12 are zero, the CLK 1 clock is able to go to a logic one level, such that the clocks CLK 1 and CLK 2 are reliably nonoverlapping during the negative transition of the input clock.

Stated differently, since the output of NOR gate 12, that is CLK 1, can only go high when both inputs to the NOR gate 12 are low, the CLK 1 clock can go high only when the input clock and the CLK 2 clock are both low. Conversely, whenever the CLK 2 clock is high, the CLK 1 clock is constrained to be low. Thus, the clock generator circuit of FIG. 2 ensures that two-phase clocks CLK 1 and CLK 2 cannot overlap as desired.

It will thus be appreciated that the clock generator of the invention reliably provides nonoverlapping clock pulses in an arrangement which requires a relatively small number of MOS devices and a relatively low utilization of power. It will also be appreciated that possible modifications to the specific embodiment of a clock generator described hereinabove may be made by those having skill in the art without necessarily departing from the spirit and scope of the invention.

What is claimed is:

1. A clock generator for providing first and second nonoverlapping clocks comprising a clock input for receiving an input clock, a depletion-mode MOS device having an input terminal connected to said clock input and an output terminal connected to its gate, and a NOR gate having an output, a first input connected to the output terminal of said MOS device and a second input connected to said clock input, whereby the outputs of said MOS device and of said NOR gate are respectively said nonoverlapping first and second clocks.

* * * * *